United States Patent
Paes et al.

[19]

[11] Patent Number: 5,908,043
[45] Date of Patent: Jun. 1, 1999

[54] PORTABLE TENT ASSEMBLY FOR USE WITH A RADIO FREQUENCY SHIELDED ENCLOSURE

[75] Inventors: Ned Z. Paes, Manassas, Va.; Terry Phillips, Bellefonte, Pa.; Robert E. Thomas, Manassas; Joseph H. Aldridge, Dale City, both of Va.

[73] Assignee: Bema, Inc., Manassas, Va.

[21] Appl. No.: 07/829,314

[22] Filed: Feb. 3, 1992

[51] Int. Cl.⁶ ................................................. E04H 15/46
[52] U.S. Cl. .......................... 135/139; 135/156; 135/117; 135/909; 135/115
[58] Field of Search .............................. 135/81, 105, 106, 135/107, 108, 109, 115, 909, 117, 120, 91, 93, 900–902; 52/220.1, 220.8, 219, 233.6, 262, 264; 160/349.1, 349.2, 184

[56] References Cited

U.S. PATENT DOCUMENTS

| | | | |
|---|---|---|---|
| 2,007,295 | 7/1935 | Coble .................................. | 252/262 X |
| 2,511,452 | 6/1950 | Anderson et al. ...................... | 135/157 |
| 2,614,512 | 10/1952 | Gross .................................... | 52/262 X |
| 2,711,180 | 6/1955 | Sims et al. ............................. | 135/106 |
| 2,840,400 | 6/1958 | D'Azzo ................................. | 135/106 X |
| 3,051,163 | 8/1962 | Trexler ................................. | 135/106 X |
| 3,424,178 | 1/1969 | Yazati .................................. | 135/909 X |
| 3,498,587 | 3/1970 | Friedberg ............................. | 135/109 X |
| 3,766,844 | 10/1973 | Donnelly et al. ...................... | 135/93 X |
| 3,834,410 | 9/1974 | Liebel .................................. | 135/105 X |
| 4,037,376 | 7/1977 | Baal-Taxa ............................. | 52/775 X |
| 4,077,418 | 3/1978 | Cohen . | |
| 4,231,289 | 11/1980 | Domicent ............................. | 135/117 X |
| 4,297,524 | 10/1981 | Fork .................................... | 52/220.1 X |
| 4,473,826 | 9/1984 | Pusch et al. .......................... | 135/93 X |
| 4,706,551 | 11/1987 | Schenfield ............................ | 135/117 X |
| 4,866,833 | 9/1989 | Ward ................................... | 135/105 X |
| 4,982,536 | 1/1991 | Muhlethaler ......................... | 52/220.1 |
| 5,094,287 | 3/1992 | Vargas et al. ........................ | 160/349.1 X |
| 5,133,378 | 7/1992 | Tanasychuk ......................... | 135/901 X |

FOREIGN PATENT DOCUMENTS

| | | | |
|---|---|---|---|
| 0155393 | 9/1985 | European Pat. Off. . | |
| 0674044 | 1/1930 | France .................................. | 135/904 |
| 982670 | 6/1951 | France . | |
| 1164212 | 10/1958 | France . | |
| 2726957 | 12/1978 | Germany ............................. | 135/91 |
| 8705652 | 9/1987 | WIPO . | |

*Primary Examiner*—Lanna Mai
*Attorney, Agent, or Firm*—Neil F. Markva

[57] ABSTRACT

This technical disclosure is for a structurally self-contained, RF-shielded enclosure which is rapidly deployable due to it's ultra light weight and ease of assembly. Assembled by one person in one half hour, the enclosure becomes an RF-shielded, free standing room within an existing non-secure room or environment. Lightweight metallized fabric is sewn together with rugged tent fabric and ballistics cloth. Fiberglass rods are connected to aluminum sleeves and unions to configure the room. A bulkhead assembly penetrates the side wall and provides filtered power and electronic signal interfaces. Honeycomb air guides and an electric fan facilitate air exchange within the room.

23 Claims, 6 Drawing Sheets

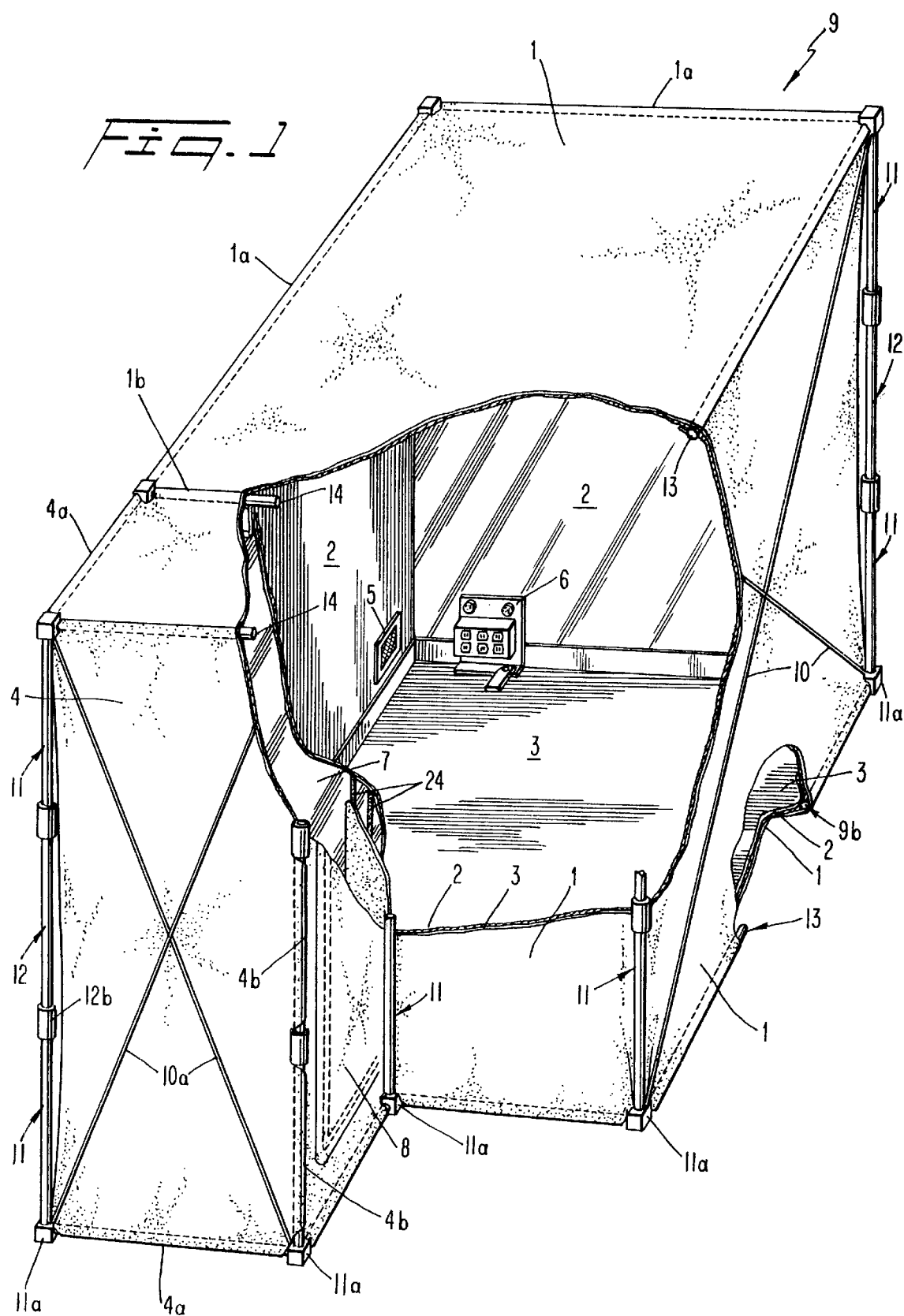

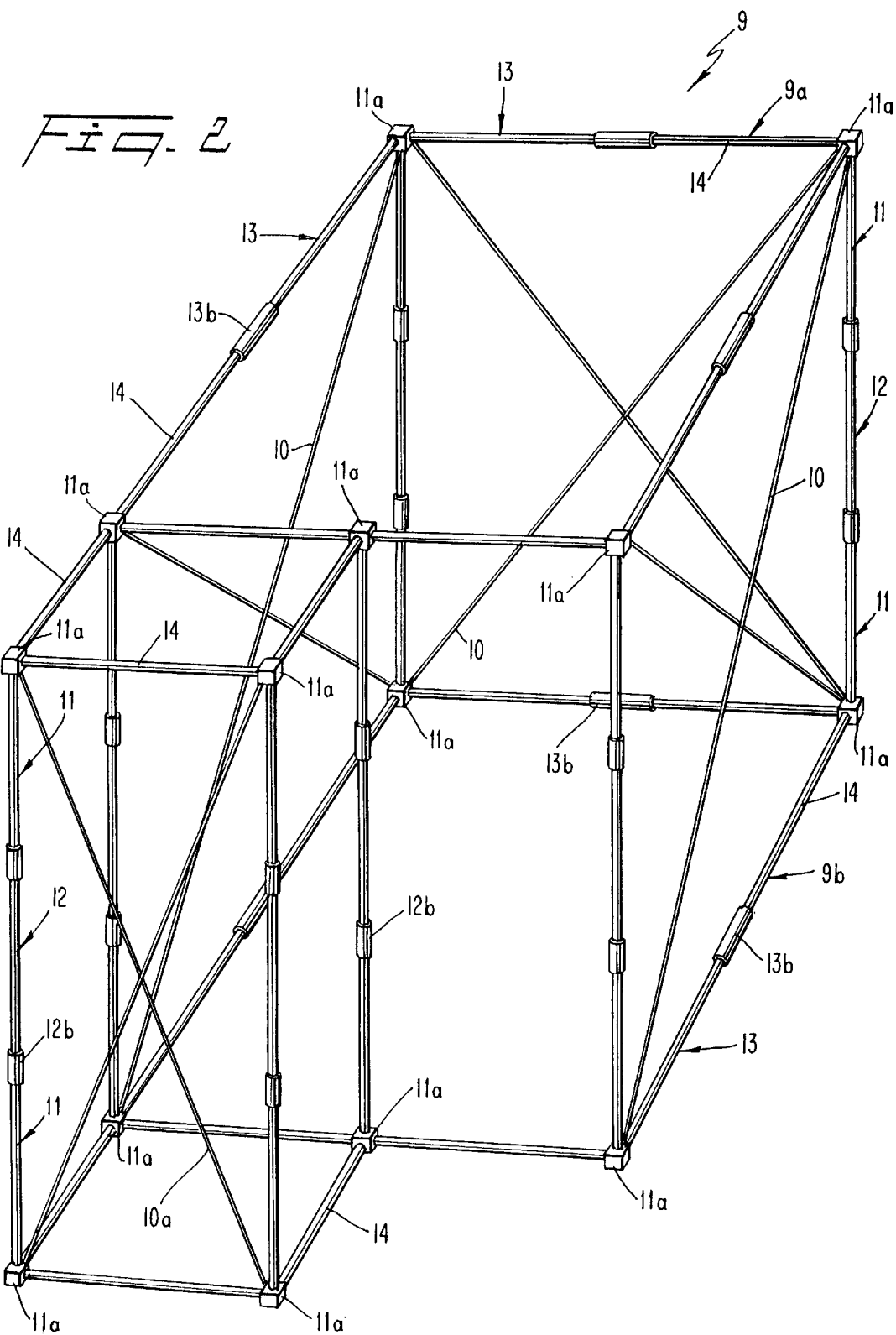

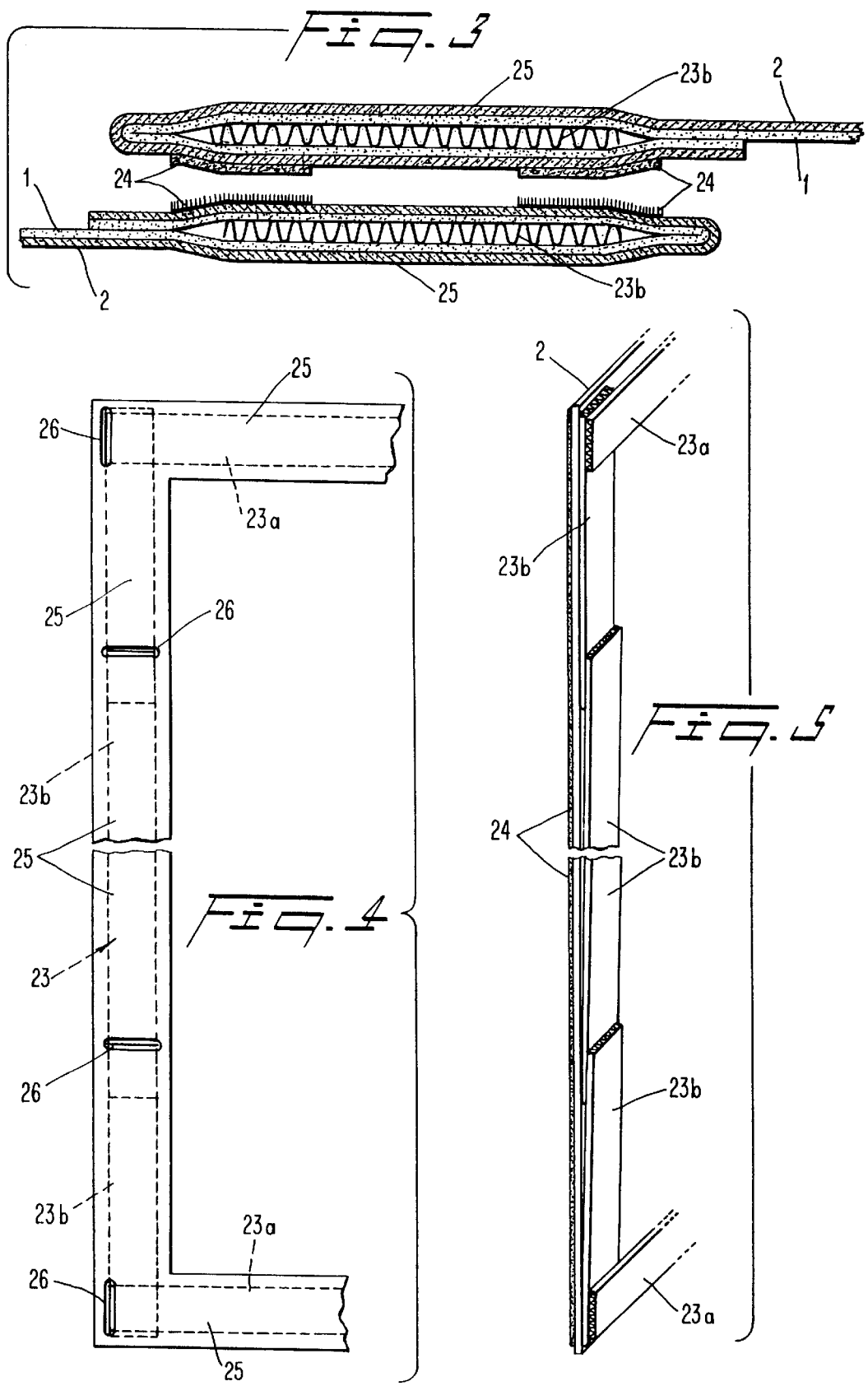

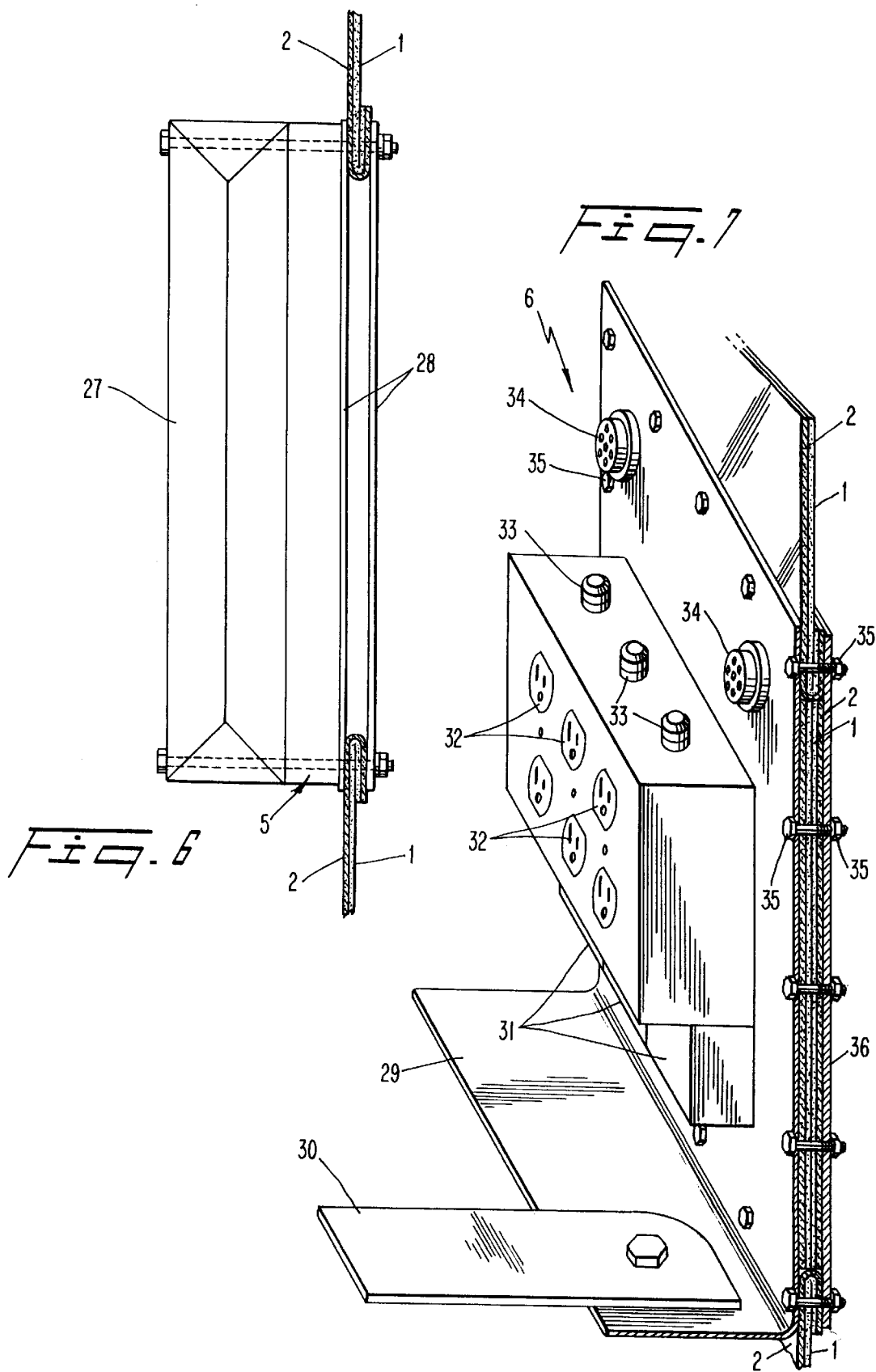

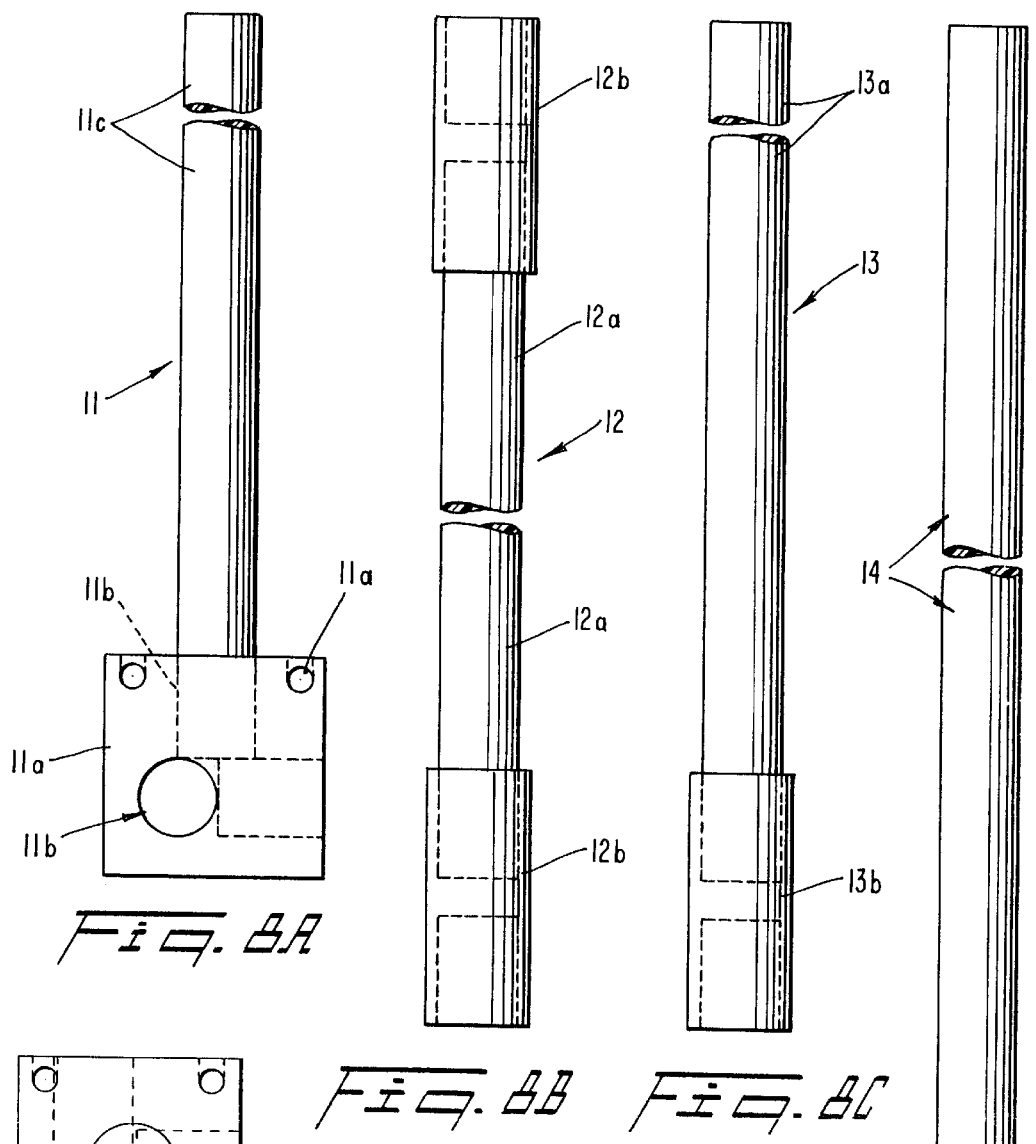
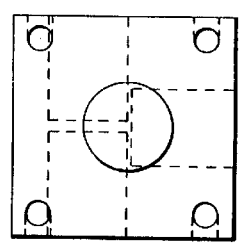
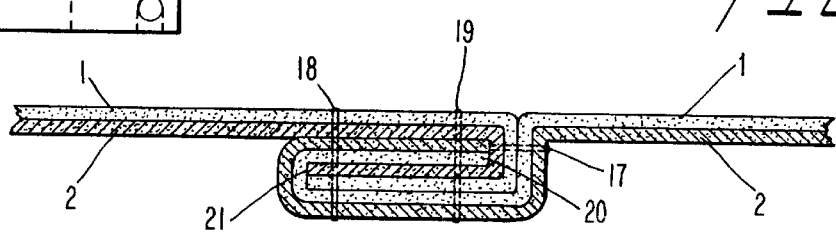

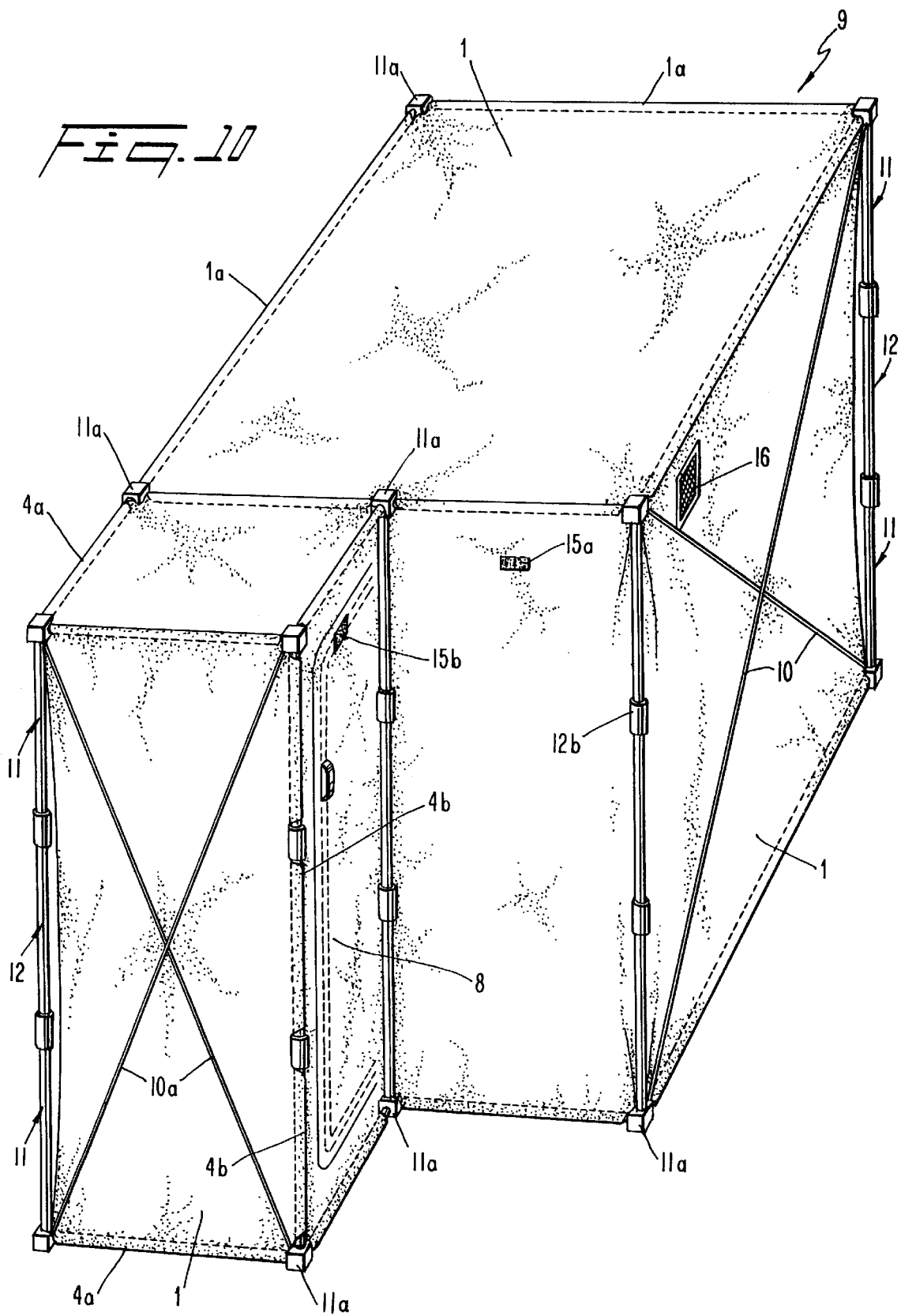

PORTABLE TENT ASSEMBLY FOR USE WITH A RADIO FREQUENCY SHIELDED ENCLOSURE

FIELD OF THE INVENTION

This invention relates to a portable tent assembly that may be carried, assembled, and disassembled by one person. More particularly, the invention is directed to a portable tent assembly composed of a frame assembly and an enclosure of flexible material which blocks the passage of radio frequency (RF) transmission.

BACKGROUND OF THE INVENTION

The requirement for low-cost, portable and rapidly deployable shielded enclosures for temporary RF-secure electronic operations has long existed. During and immediately after fires, civil disturbances and natural disasters, the deployment or relocation of RF-secure electronic operations in a timely, efficient manner is often a critical part of the restoration to operational normalcy.

The objective of this invention relates to the use of shielded rooms or enclosures, shielded specifically against radio frequency interference. The invention addresses the aforementioned requirements for a cost-effective, ultralight, portable and rapidly deployable shielded enclosure for temporary, RF-secure electronic operations. The temporary requirement can exist because of the aforementioned emergency situations or, for a non-emergency, short-term requirement that does not warrant the expense of a permanent, shielded facility.

Although a handful of other devices are known, no other device meets the objectives of providing up to 60 decibels of attenuation across the preferred frequency range; and packaging as an ultralight portable, rapidly deployable, enclosure.

SUMMARY OF THE INVENTION

The portable tent assembly of this invention comprises a free-standing RF-shielded room or flexible enclosure which one person can assemble within thirty minutes as a shielded room within a larger existing room. The enclosure design provides maximum useable floor space with sufficient electrical power, air exchange, and RF protection for temporary, RF-secure electronic operations.

A specific embodiment of the flexible enclosure includes three types of fabric. The first fabric or inner cloth is a lightweight, woven or non-woven, metallized fabric consisting of any of the following combinations of metal coatings: copper, nickel, nickel-on-copper, tin-on-copper, or silver-on-copper. The second fabric or outer cloth is a lightweight, woven, #400 Denier nylon, tent fabric. The third fabric or floor liner is a rugged, polypropylene fiber, ballistics fabric.

The inner and outer cloths are folded and sewn together using the French-fold method. The French-fold adds strength to the seam and provides electrical continuity of the inner cloth throughout the enclosure.

The enclosure includes two distinct floor space areas. A larger operations area or den is for equipment and personnel habitation. A smaller access area or foyer is a passageway for personnel to gain access to the larger area. The externally attached foyer reserves all floor space in the den for operational use and acts as an RF maze to provide RF-secure entry and departure to and from the den during continual operation of the electronic equipment within the den.

Two uniquely-designed doors each incorporate two spaced strips of conductive Velcro sewn around the door edge and around the door frame to form an air gap therebetween. This radio frequency securing means produces a radio frequency-secure door opening when the door is in a closed position.

Rigid stabilizer members inserted into pockets sewn around the door and door frame provide a rigid surface for a positive seal between the frame and door. The stiffened door frame also provides support for the radio frequency securing means.

An external or outer frame assembly supports the flexible enclosure. The frame assembly comprises fiberglass rods inserted into aluminum sleeves which facilitate linear extension and connection between rods. Rod ends are inserted into milled, aluminum unions at all corners and junction points to facilitate the proper angular alignments needed to form the den and foyer.

The attachment of the outer cloth to the frame assembly is made by inserting all of the top and bottom horizontal rods through cloth conduits sewn onto the outer cloth around the top and bottom edges of the enclosure. Elastically stretchable shock cords are attached to and stretched between unions in an "X" pattern to add further stability to the assembled structure.

In the preferred embodiment, the enclosure is constructed with penetrations for honeycomb air-guides and a fan to provide air exchange, and for a bulkhead assembly to provide filtered power and signal connectivity. All penetration hardware used in the enclosure including the honeycomb air-guides and bulkhead assembly is rated for the appropriate radio-frequency attenuation.

The transport and storage bags for the current invention are constructed of the same material as the floor liner. The bags stow all parts in pre-sized, pre-marked compartments for ease of identification and sequence of use during assembly.

The lightweight, durability of construction and the ease of assembly of the present invention will become more readily apparent from a consideration of the following drawings and description.

BRIEF DESCRIPTION OF THE DRAWINGS

Other objects of this invention will appear in the following description and appended claims, reference being made to the accompanying drawings forming a part of the specification wherein like reference characters designate corresponding parts in the several views.

FIG. 1 is a fragmentary perspective view of the fully-assembled enclosure and shows inner and outer cloths sewn together with the floor liner and supported by the external frame assembly.

FIG. 2 is a perspective view of the complete external frame assembly including the placement of shock cords.

FIG. 3 is a fragmentary cross-sectional view of the construction of a door and door-frame showing the inner and outer cloth (along with the two conductive Velcro strips and air gap), and placement of stabilizers within pockets sewn into the outer cloth.

FIG. 4 is a fragmentary elevational view showing stabilizer pockets sewn into the outer cloth around the door and door-frame and the access slots into which the stabilizers are inserted during assembly.

FIG. 5 is a fragmentary perspective view of the structure of FIG. 4 showing the relational position of the stabilizers around the doors and frames with the inner and outer cloth removed.

FIG. 6 is an elevational view, in partial section, of the honeycomb air guide and fan (attached to the enclosure wall), which details the mechanical and electrical continuity between the inner cloth and the metal frames.

FIG. 7 is a fragmentary perspective view of the bulkhead assembly (attached to the enclosure wall), detailing the mechanical and electrical continuity between the inner cloth, the bulkhead frame and the bulkhead panel.

FIGS. 8A, 8B, 8C, and 8D are elevational views of the four basic rod subassemblies used to configure the external frame assembly.

FIG. 9 is a cross-sectional view of the French fold seam used to connect the inner and outer cloths.

FIG. 10 is a perspective view of an assembled tent is structure of the invention.

DETAILED DESCRIPTION

The entire shielded enclosure includes multiple "off the shelf" items. In FIG. 1, the shielded enclosure outer cloth 1 is a nylon tent material which covers and is sewn to an inner cloth 2 of metallized nylon ripstop fabric. Outer edges of outer cloth 1 and inner cloth 2 are folded and sewn together as shown in FIG. 9 to produce a French-fold seam. (Refer to FIG. 9).

The floor liner 3 covers the floor and lower edge of the inside wall with ballistics-cloth. The shielded enclosure includes a foyer or access area 4 with both an inner door 7 and outer door 8. Air flow is provided through honeycomb air guides 5. Electrical and signal entry and egress is through a bulkhead assembly 6.

The entire shielded enclosure is supported by a fiberglass and aluminum outer frame assembly 9, rigidized with six shock cords 10 on three sides and two shorter shock cords 10A on the front of the foyer area 4. As evidenced in this disclosure, shock cords 10 and 10A are composed of elastically stretchable material to stretch between opposing top and bottom corners of selected vertically disposed sides of the outer framework assembly as shown.

FIG. 2 shows a separable outer frame assembly 9 constructed of three specific types of rigid rod subassemblies and one length of fiberglass rod as shown in FIGS. 8A, 8B, 8C, and 8D. The first rod subassembly or union 11 includes a rigid rod coupling member that consists of a milled aluminum block 11a having four holes 11b which are drilled to accept insertion of three horizontal rigid rods and one vertical rigid rod. A vertical rod 11c is permanently inserted into a single vertical rod opening 11b to form union 11. Milled openings 11d receive attachment of shock cords 10 or 10A depending on the location of the particular union 11 as shown in FIG. 2.

The second rod subassembly or vertical rod subassembly 12 shown in FIG. 8B consists of a fiberglass rod 12a permanently affixed to sleeve 12b at each end thereof. Vertical rod subassembly 12 is the center section of the seven vertical supports as shown in FIG. 2.

The third rod subassembly or horizontal rod subassembly 13 shown in FIG. 8C consists of a fiberglass rod 13a permanently affixed to aluminum sleeve 13b at one end thereof. Six horizontal rod assemblies are located on three frame side sections along the closed periphery of each top and bottom frame subassembly 9a and 9b, respectively.

As shown in the drawings and described herein, the separate rods are detachably and nonpivotally connected by the rod coupling members to form a frame structure having a plurality of vertically and horizontally rigid, nonpivotally connected rod members disposed to support the tent enclosure in an upright unfolded condition.

The length of fiberglass rod or tie rod 14 shown in FIG. 8D consists of a fiberglass rod with no permanent attachments. A tie rod 14 is inserted into unions 11 and vertical rod subassemblies 12 as required to construct the outer frame assembly 9.

In this specific embodiment, rods 11c, 12a, 13a, and 14 vary in length. The specific design of outer frame assembly 9 with frame subassemblies 9a and 9b includes fourteen unions 11, seven vertical rod assemblies 12, six horizontal rod assemblies 13, and sixteen tie rods 14.

As shown in FIG. 1, operations section 1 of the flexible enclosure includes outer sleeves 1a, 1b, 4a, and 4b at intersecting portions of the enclosure. Outer sleeves 1a, 1b, 4a, and 4b comprise rod holding means along corner or intersecting portions of the enclosure for removably locating at least one rigid member extending between two rigid coupling members as shown.

The outer frame assembly, as shown in the drawings, includes horizontally disposed and substantially identically shaped top and bottom frame subassemblies 9a and 9b, each defining a closed periphery. Each of the top and bottom frame subassemblies 9a and 9b include at least one rod member extending between rod coupling members as shown. Thus, the closed periphery includes a plurality of frame side sections each having outer ends and an end rod coupling member located at each said outer end thereof as illustrated.

In this embodiment, rod subassemblies 11, 12, and 13, shown in FIGS. 8A, 8B, 8C, and 8D, comprise a rod fixedly attached to a rod coupling member. Rods 14 are removably connected to coupling members as are the free ends of rods 11c, 12a, and 13a that are not fixed to a coupling member.

As shown assembled, vertically disposed rod members are connected to corresponding end rod or corner coupling members 11a at the outer ends of each frame side section when the top and bottom frame subassemblies 9a and 9b are registered with respect to each other.

As evidenced by the drawings, the vertically disposed rod members with the horizontally disposed and registered top and bottom frame subassemblies 9a and 9b define a plurality of vertically disposed profiles each having two upper end joints and two lower end joints. In this specific embodiment, the vertically disposed profiles are rectangular and each have two upper corners and two lower corners.

As seen assembled in FIGS. 1 and 2, elastic cord members 10 and 10a are removably connected to and stretched between opposing top and bottom joints of selected vertically disposed profiles. In this specific embodiment, rod subassemblies 11, 12, and 13, and rods 14 are straight and form vertically disposed rectangular profiles having two upper corners and two lower corners. Thus, cord members 10 and 10a are connected to and stretched diagonally between opposing top and bottom corners to form an X across the rectangular profile as shown. In this embodiment, coupling members in rod subassembly 11 includes holes 11d milled into each corner thereof as shown in FIG. 8A.

When mounted to the outer frame assembly 9, the shielded enclosure forms an operations chamber and an access chamber into which a person must enter through openings or doors 7 and 8 shown located in the enclosure side wall portion. The ingress and egress doors 7 and 8 are each located within a vertically disposed profile of the outer frame assembly 9 that has no cord members 10 stretched between its opposing top and bottom corners.

As disclosed herein, the flexible enclosure and outer frame assembly have a combined weight effective to allow one adult person to carry the tent assembly when disassembled. The flexible enclosure and outer frame assembly rod member, coupling members, and cord members have a size effective so that only one adult person may erect the tent assembly.

The fourteen first rod subassemblies or unions 11 are all identical and interchangeable as, top or bottom, corner or "T" unions. The seven vertical rod subassemblies 12, as shown, tie the top and bottom unions 11 together at each vertical support position. In this embodiment, there are six horizontal rod subassemblies 13 and sixteen tie rods 14.

One horizontal rod subassembly 13 and one tie rod 14 are fitted together and inserted into rod holding sleeves 1a and slip fit into each top and bottom union 11 on three sides of the enclosure den area (as shown in FIG. 2). The remaining tie rods 14 are inserted into rod holding sleeves 4a and 1b and fitted horizontally into the top and bottom unions 11 at the foyer end of the den or operations area 1 and around the foyer or access area 4 to complete the outer frame assembly 9.

The six long elastic shock cords 10 are installed in an "X" configuration as shown in FIG. 2 on three sides of the den portion of the frame assembly 9 and the two shorter shock cords 10A are placed on the front of the foyer area 4.

FIG. 3 shows corrugated plastic flat stock as stabilizers 23 for both inner door 7 and outer door 8 and their respective frames. Two conductive, spaced pairs of silver coated Velcro strips 24 are disposed along the edge of the door frame structure and door edges to produce a radio frequency-secure door opening when the door is in a closed position. In other words, because radio-frequency signals are electronic signals, the door frame structure includes electronic signal-securing means to prevent electronic signal transmission into and out of the flexible enclosure along an outer edge of the door member when the door member is in a closed position. Thus, Velcro strips 34 produce an electronic signal-securing opening means when the door member is in a closed position. In this embodiment, the door frame structure and door edges overlap as shown.

FIG. 5 shows stabilizers 23 inserted into pockets 25 sewn into outer cloth 1 to make the frames of doors 7 and 8 more rigid and to assure positive contact of the conductive Velcro strips 24 sewn onto mating surfaces of the inner cloth 2.

FIG. 4 shows three vertical end two horizontal pockets 25 sewn around the frame of each door 7 and 8 with access slots 26 for insertion and removal of the stabilizers 23.

FIG. 5 depicts how the stabilizers 23 overlap when inserted into the pockets 25 providing rigidity to doors 7 and 8 and their respective frames. In this embodiment, the horizontally disposed stabilizers 23a overlap the vertical stabilizers 23b four inches and vertical stabilizers 23b overlap each other six inches.

FIG. 6 shows the honeycomb air-guide 5 and the attached fan 27 constitutes blowing means which provides air assistance during assembly of the shielded enclosure and, together with air exhaust outlet 16, air exchange during actual operations. The fan 27 and honeycomb air guide 5 are bolted together and attached to a frame 28. The frame 28 is permanently affixed to the shielded enclosure wall with the inner cloth 2 having a metal coating that makes full contact with the frame 28. The second honeycomb air-guide 5 (or exhaust), (not shown), is treated identically to the intake air-guide except that there is no fan. Because the enclosure structure precludes transmission of electronic radio-frequency signals, honeycomb air-guide 5 necessarily includes means for attenuating electronic radio-frequency signals through the air intake and exhaust openings.

FIG. 7 shows the mechanical layout and identification of the bulkhead assembly components. A composite of the electrical and signal bulkhead assembly 6 includes an "L" shaped panel 29 with a ninety degree "swing" foot 30 for stabilization. The bulkhead panel 29 houses three RF filters 31, three duplex receptacles 32, and three in-line fuse or circuit breaker assemblies 33 to provide three separate, twenty-ampere, RF-protected, electrical circuits. The three RF filters constitute an electronic signal interference filter.

In addition, the bulkhead panel 29 houses two fiber optic guides 34 for signal entry and egress therefore constituting means for electrically connecting bulkhead panel 29 to a source of externally disposed electrical power. The bulkhead assembly 6 is affixed to the enclosure wall with captive screws 35 entering a frame 36 which is permanently attached to the inner cloth 2. Other entry/egress connectors and methods for electrically connecting bulkhead panel 29 to a source of externally disposed electrically power will be affixed to the bulkhead panel 29 as requirements dictate.

FIG. 9 shows the edges 20 and 21 of layered outer cloth 1 and inner cloth 2 overlapped and folded as shown. The overlapped and folded fabric edges 20 are sewn along locations 17, 18, and 19 as shown. The French-fold seam assures inner cloth electrical continuity throughout the enclosure.

FIG. 10 shows the outside dimensions of the assembled tent structure disclosing the air exhaust outlet 16, and Velcro strips 15a and 15b used to hold door 8 open as needed. These parts were in the cut away portion as shown in FIG. 1.

The foregoing disclosure and description of the invention are illustrative and explanatory thereof, and various changes in size, shape and materials as well as in the details of the illustrated construction may be made without departing from the spirit of the invention.

What is claimed in the preferred embodiment is:

1. A portable tent assembly for personnel comprising:
  a) means for defining an operations area sufficient to contain personnel and equipment including a flexible enclosure and an outer frame assembly;
  b) said flexible enclosure defining an enclosed chamber having said operations work area, and including a top ceiling portion, a bottom floor portion, and a side wall portion fixedly connected along a top edge to the top ceiling portion, and along a bottom edge to the bottom floor portion;
  c) said outer frame assembly including a plurality of rigid rod members, a plurality of rigid rod coupling members, and a plurality of elastically stretchable cord members, and further including top and bottom frame subassemblies, each said frame subassembly defining a closed periphery;
  d) said flexible enclosure being composed of foldable flexible sheet material and including rod holding means fixedly disposed along intersecting portions of the enclosure for removable locating at least one rod member extending between two rod coupling members along the entire said closed periphery;
  e) each said top and bottom frame subassembly including at least one rod member removable extending between rod coupling members to form a plurality of frame side sections along said closed periphery;
  f) each frame side section having outer ends and an end rod coupling member located at each said outer end thereof;

g) when assembled, said outer frame assembly including vertically disposed rod members removable connected to corresponding end rod coupling members at the outer ends of each frame side section when the top and bottom frame subassemblies are registered with respect to each other;

h) said vertically disposed and registered top and bottom frame subassemblies define a plurality of vertically disposed profiles each having two upper end joints and two lower end joints;

i) when said outer frame assembly is assembled, an elastic cord member is removable connected to and stretched between opposing top and bottom end joints of selected vertically disposed profiles;

j) said enclosure side wall portion including an opening for ingress and egress of personnel from said enclosed chamber formed within the flexible enclosure when mounted to the assembled outer frame assembly;

k) said ingress and egress opening being located within a vertically disposed profile of the outer frame assembly that has no cord members stretched between its opposing top and bottom end joints;

l) the flexible enclosure and outer frame assembly having a combined weight effective to allow one adult person to carry the tent assembly when disassembled; and m) the flexible enclosure and outer frame assembly rod members, coupling members, and cord members having a size effective so that only one adult person may erect the tent assembly;

n) the foldable flexible sheet material precludes radio frequency transmission therethrough to provide radio frequency shielding;

o) the side wall portion including a radio frequency-secure ingress and egress door opening for personnel moving into and out of said enclosed chamber and has a door member pivotally movable along one side thereof between a closed and open position, p) said side wall portion including door frame structure means for providing stability along the edge of the door opening, q) said door frame structure means including radio frequency-securing means to prevent radio frequency transmission along an outer edge of the door member and the adjacent edge of the door opening when the door member is in a closed position;

r) said door frame structure means including pocket means disposed along the edge of the door opening, and rigid stabilizer means removable disposed within the pocket means to stiffen the edge portion of the door opening for receiving the door in a closed condition and for providing support for the radio frequency-securing means.

2. An assembly as defined in claim 1 wherein
said pocket means includes a plurality of elongated pocket members and the stabilizer means includes a plurality of rigid stabilizer members each having a structural configuration effective to be inserted into an elongated pocket member.

3. A portable tent assembly comprising:
a) means for defining an operations area sufficient to contain personnel and equipment including a flexible enclosure and an outer frame assembly;
b) said flexible enclosure defining an enclosed chamber having said operations work area, and including a top ceiling portion, a bottom floor portion, and a side wall portion fixedly connected along a top edge to the top ceiling portion, and along a bottom edge to the bottom floor portion;
c) said outer frame assembly including a plurality of rigid rod members, a plurality of rigid rod coupling members, and a plurality of elastically stretchable cord members;
d) said flexible enclosure being composed of foldable flexible sheet material and including rod holding means fixedly disposed along intersecting portions of the enclosure for removable locating at least one rod member extending between two rod coupling members;
e) said outer frame assembly including top and bottom frame subassemblies, each said frame subassembly defining a closed periphery;
f) each said top and bottom frame subassembly including at least one rod member removable extending between rod coupling members to form a plurality of frame side sections along said closed periphery;
g) each frame side section having outer ends and an end rod coupling member located at each said outer end thereof;
h) when assembled, said outer frame assembly including vertically disposed rod members removable connected to corresponding end rod coupling members at the outer ends of each frame side section when the top and bottom frame subassemblies are registered with respect to each other;
i) said vertically disposed and registered top and bottom frame subassemblies define a plurality of vertically disposed profiles each having two upper end joints and two lower end joints;
j) when said outer frame assembly is assembled, an elastic cord member is removable connected to and stretched between opposing top and bottom end joints of selected vertically disposed profiles;
k) said enclosure side wall portion including an ingress and egress opening for moving personnel and equipment into and out of said enclosed chamber formed within the flexible enclosure when mounted to the assembled outer frame assembly;
l) said ingress and egress opening being located within a vertically disposed profile of the outer frame assembly that has no cord members stretched between its opposing top and bottom end joints;
m) the flexible enclosure and outer frame assembly having a combined weight effective to allow one adult person to carry the tent assembly when disassembled;
n) the flexible enclosure and outer frame assembly rod members, coupling members, and cord members having a size effective so that only one adult person may erect the tent assembly;
o) the foldable flexible sheet material precludes radio frequency transmission therethrough to provide radio frequency shielding;
p) the side wall portion including a door member pivotally movable along one side thereof between a closed and open position,
q) door frame structure means for providing stability along the edge of the door opening,
r) said door frame structure means including radio frequency-securing means to prevent radio frequency transmission along an outer edge of the door member and the adjacent edge of the door opening when the door member is in a closed position;

s) the flexible enclosure including an air intake opening, an air exhaust opening, and fixedly mounted electrical power bulkhead panel means;

t) the air intake opening and air exhaust opening are each defined within a rigid frame structure mounted to a honeycomb air guide;

u) said air intake opening includes blowing means attached to blow air through the honeycomb air guide into the enclosure whereby said blowing means provides an air assist during the initial assembly of the frame and enclosure, and air exchange during occupancy of the enclosure.

4. A portable tent assembly comprising:

a) means for defining an operations area sufficient to contain personnel and equipment including a flexible enclosure and an outer frame assembly;

b) said flexible enclosure defining an enclosed chamber having said operations work area, and including a top ceiling portion, a bottom floor portion, and a side wall portion fixedly connected along a top edge to the top ceiling portion, and along a bottom edge to the bottom floor portion;

c) said outer frame assembly including a plurality of rigid rod members, a plurality of rigid rod coupling members, and a plurality of elastically stretchable cord members;

d) said flexible enclosure being composed of foldable flexible sheet material and including rod holding means fixedly disposed along intersecting portions of the enclosure for removable locating at least one rod member extending between two rod coupling members;

e) said outer frame assembly including top and bottom frame subassemblies, each said frame subassembly defining a closed periphery;

f) each said top and bottom frame subassembly including at least one rod member removable extending between rod coupling members to form a plurality of frame side sections along said closed periphery;

g) each frame side section having outer ends and an end rod coupling member located at each said outer end thereof;

h) when assembled, said outer frame assembly including vertically disposed rod members removable connected to corresponding end rod coupling members at the outer ends of each frame side section when the top and bottom frame subassemblies are registered with respect to each other;

i) said vertically disposed and registered top and bottom frame subassemblies define a plurality of vertically disposed profiles each having two upper end joints and two lower end joints;

j) when said outer frame assembly is assembled, an elastic cord member is removable connected to and stretched between opposing top and bottom end joints of selected vertically disposed profiles;

k) said enclosure side wall portion including an ingress and egress opening for moving said personnel and equipment into and out of said enclosed chamber formed within the flexible enclosure when mounted to the assembled outer frame assembly;

l) said ingress and egress opening being located within a vertically disposed profile of the outer frame assembly that has no cord members stretched between its opposing top and bottom end joints;

m) the flexible enclosure and outer frame assembly having a combined weight effective to allow one adult person to carry the tent assembly when disassembled;

n) the flexible enclosure and outer frame assembly rod members, coupling members, and cord members having a size effective so that only one adult person may erect the tent assembly;

o) the foldable flexible sheet material precludes radio frequency transmission therethrough to provide radio frequency shielding;

p) the side wall portion including a door member pivotally movable along one side of said ingress and egress opening between a closed and open position;

q) door frame structure means for providing stability along the edge of the ingress and egress opening;

r) said door frame structure means including radio frequency-securing means to prevent radio frequency transmission along an outer edge of the door member and the adjacent edge of the door opening when the door member is in a closed position;

s) the flexible enclosure including an air intake opening, an air exhaust opening, and a fixedly mounted electrical power bulkhead panel;

t) the bulkhead panel is mounted to a frame structure fixedly connected to the side wall portion adjacent the bottom floor portion;

u) said bulkhead panel including means for stabilizing the panel in an upright position;

v) said bulkhead panel including a radio frequency filter, an electrical outlet receptacle, a circuit breaker assembly, a fiber optic guide means for signal entry and egress.

5. A frame assembly for a portable tent having an operations area for personnel, said frame assembly comprising:

a) means for defining an operations work area for personnel including a top frame subassembly and a bottom frame subassembly each defining a closed periphery around said operations area for personnel;

b) said top and bottom frame subassemblies including a plurality of rigid rod members, means for detachably connecting the rigid rod members, and means for connecting the top and bottom subassemblies;

c) said means for detachably connecting the rigid rod members including a plurality of rigid rod coupling members;

d) said means for connecting the top and bottom assemblies including a plurality of elastically stretchable cord members;

e) each said top and bottom frame subassembly including at least one rod member removable connected and extending between rod coupling members to form a plurality of frame side sections along said closed periphery;

f) each frame side section having outer ends and means for connecting rod members including an end rod coupling member located at each said outer end of each frame side section to form an assembly;

g) when assembled, said outer frame assembly including vertically disposed rod members removable connected to corresponding end rod coupling members at the outer ends of each frame side section when the top and bottom frame subassemblies are registered with respect to each other;

h) said vertically disposed and registered top and bottom frame subassemblies define a plurality of vertically disposed profiles each having two upper end joints and two lower end joints; and i) when said outer frame assembly is assembled, an elastic cord member is removable connected to and stretched between opposing top and bottom end joints of selected vertically disposed profiles;

j) the outer frame assembly rod members, coupling members, and cord members having a size effective so that only one adult person may erect the frame assembly k) the top and bottom frame subassemblies are horizontally disposed and define substantially identically shaped closed peripheries, l) said means for defining said operations area for personnel including a personnel access area section and a personnel operations work area section, m) each of the frame subassemblies includes seven said coupling members having three horizontal rod-receiving openings n) said means for detachably connecting said rod members including one vertical rod-receiving opening in each of said seven coupling members, three said coupling members define sleeve coupling members having a horizontal rod-receiving opening at each end thereof, and means for detachably and horizontally interconnecting the coupling members including eleven said rod members to form two rectangular profiles that share a common frame section for horizontal disposition.

6. An assembly as defined in claim 5 wherein said top and bottom frame subassemblies have a total of fourteen said coupling members and six said sleeve coupling members, each of said fourteen coupling members includes a vertical rod member permanently affixed within each vertical rod-receiving opening each thereby forming a first rod subassembly having a vertical rod member with a free end, and each of said six sleeve coupling members includes a rod member permanently affixed within one horizontal rod-receiving opening each thereby forming a horizontal rod subassembly.

7. An assembly as defined in claim 6 wherein said vertically disposed rod members include two of said permanently affixed vertical rod members for removable connection to a vertical rod subassembly, said vertical rod subassembly includes a rod member having two ends thereof permanently affixed within a vertical rod-receiving opening of two sleeve coupling members each having a second vertical rod-receiving opening for removable connecting the free ends of said vertical rod members of said first rod assembly.

8. An assembly as defined in claim 7 wherein a transport and storage bag includes pre-sized, and pre-marked compartments to receive said rods and coupling members when the frame assembly is disassembled.

9. A portable tent assembly comprising:

a) a foldable tent enclosure defining an operations work area sufficient to contain for effecting electronic operations equipment, b) said tent enclosure including a top ceiling portion, a bottom floor portion, and a side wall portion fixedly connected along a top edge to the top ceiling portion, and along a bottom edge to the bottom floor portion, and c) a portable set of separate frame elements for forming a separable outer tent frame structure including a plurality of separate rigid rod members and a plurality of rigid rod coupling members for detachably and non-pivotally connecting the rigid rod members to form a frame structure having a plurality of vertically and horizontally rigid, nonpivotably connected rod members disposed to support the tent enclosure in an upright unfolded condition, d) a first portion of said plurality of coupling members including corner coupling members each having first rod connecting means for detachably coupling a plurality of horizontally disposed rod members and second rod connecting means for coupling one vertically disposed rod member, e) a second portion of said plurality of coupling members including sleeve coupling members having rod coupling means for connecting a rod member at each end thereof, f) the foldable tent enclosure precludes radio frequency transmission therethrough to provide radio frequency shielding, g) said side wall portion including radio frequency-secure ingress and egress door opening means for personnel moving into and out of said enclosed chamber, h) said door opening means includes a door member pivotally movable along one side thereof between a closed and open position, i) said side wall portion further including door frame structure means for providing stability along the edge of the door opening means, j) said door frame structure means including radio frequency-securing means to prevent radio frequency transmission along an outer edge of the door member and the adjacent edge of the door opening means when the door member is in a closed position, k) said door frame structure means including pocket means disposed along the edge of the door opening means, and rigid stabilizer means removable disposed within the pocket means to stiffen the edge portion of the door opening means for receiving the door in a closed condition and for providing support for the radio frequency securing means.

10. A tent assembly as defined in claim 9 wherein said pocket means includes a plurality of elongated pocket members and the stabilizer means includes a plurality of rigid stabilizer members each having a structural configuration effective to be inserted into an elongated pocket member.

11. A portable tent assembly comprising:

a) a foldable tent enclosure defining an operations work area sufficient to contain equipment for effecting electronic operations, b) said tent enclosure including a top ceiling portion, a bottom floor portion, and a side wall portion fixedly connected along a top edge to the top ceiling portion, and along a bottom edge to the bottom floor portion, and c) a portable set of separate frame elements for forming a separable outer tent frame structure including a plurality of separate rigid rod members and a plurality of rigid rod coupling members for detachably and non-pivotally connecting the rigid rod members to form a frame structure having a plurality of vertically and horizontally rigid, nonpivotably connected rod members disposed to support the tent enclosure in an upright unfolded condition, d) a first portion of said plurality of coupling members including corner coupling members each having first rod connecting means for detachably coupling a plurality of horizontally disposed rod members and second rod connecting means for coupling one vertically disposed rod member, e) a second portion of said plurality of coupling members including sleeve coupling members having rod coupling means for connecting a rod member at each end thereof, f) the foldable tent enclosure precludes radio frequency transmission therethrough to provide radio frequency shielding, g) said side wall portion including radio frequency-secure ingress and egress door opening means for moving equipment into and out of said enclosed chamber, h) said door opening means includes a door member pivotally movable along one side thereof between a closed and open position, i) said side wall portion further including door frame structure means for providing stability along the edge of the door opening means, j) said door frame structure means including radio frequency-securing means to prevent radio frequency transmission along an outer edge of the door member and the adjacent edge of the door opening means when the door member is in a closed position, k) said foldable enclosure including an air intake opening, an air exhaust opening, and fixedly mounted electrical power bulkhead panel constituting penetration hardware rated for appropriate radio-frequency attenuation.

12. An assembly as defined in claim 11 wherein
the air intake opening and air exhaust opening are each defined within a rigid frame structure mounted to a honeycomb air guide, said air intake opening includes blowing means attached to blow air through the honeycomb air guide into the enclosure whereby said blowing means provides an air assist during the initial assembly of the frame and enclosure, and air exchange during occupancy of the enclosure.

13. A tent assembly as defined in claim 11 wherein
said bulkhead panel is mounted to a frame structure fixedly connected to the side wall portion adjacent the bottom floor portion, said bulkhead panel including means for stabilizing the panel in an upright position.

14. A tent assembly as defined in claim 13 wherein
said means for stabilizing said bulkhead panel includes a pivotally mounted foot member for extending outwardly from the panel onto the bottom floor portion.

15. A tent assembly as defined in claim 13 wherein
said bulkhead panel includes a radio frequency filter, an electrical outlet receptacle, a circuit breaker assembly, and fiber optic means for signal entry and egress.

16. A free-standing portable tent assembly for providing a shielded environment for operating electronic equipment, said assembly comprising:

a) support means for maintaining collapsible flexible enclosure means in an upright position to define an enclosed operations area sufficient to contain said equipment for effecting electronic operations;

b) said flexible enclosure means including a top ceiling portion, a bottom floor portion, and a side wall portion fixedly connected along a top edge to the top ceiling portion, and fixedly connected along a bottom edge to the bottom floor portion;

c) said flexible enclosure means is composed of flexible sheet material having structural characteristic means that precludes transmission of radio-frequency signals therethrough to provide radio-frequency shielding for equipment within the enclosed operations area;

d) said side wall portion being composed of flexible material and including a radio-frequency signal-secure ingress and egress opening means having a size sufficient to move said electronic equipment into and out of said enclosed operations area within the flexible enclosure means when the flexible enclosure means is in said upright position;

e) the side wall portion including a radio-frequency signal-secure door member composed of flexible material and pivotally movable along one side thereof between a closed position and an open position and door frame structure means for providing stability along an edge portion of the opening means to support the door member in a closed position with respect to the opening means, and f) said door frame structure means including radio-frequency signal-securing means to prevent radio-frequency signal transmission into or out of the flexible enclosure means along an outer edge of the door member and the adjacent edge portion of the opening means when the door member is in a closed position with respect to the opening means, g) said door frame structure means including pocket means disposed along the edge portion of the opening means, and stabilizer means disposed within the pocket means to stiffen the edge portion of the opening means for providing support for the radio-frequency signal-securing means.

17. A tent assembly as defined in claim 16 wherein
said pocket means includes a plurality of pocket members and the stabilizer means includes a plurality of stabilizer members each having structural configuration means effective to fit within a pocket member to maintain the collapsible enclosure means in said upright position.

18. A free-standing portable tent assembly for providing a shielded environment for operating electronic equipment, said assembly comprising:

a) support means for maintaining collapsible flexible enclosure means in an upright position to define an enclosed operations area sufficient to contain said equipment for effecting electronic operations;

b) said flexible enclosure means including a top ceiling portion, a bottom floor portion, and a side wall portion fixedly connected along a top edge to the top ceiling portion, and fixedly connected along a bottom edge to the bottom floor portion;

c) said flexible enclosure means is composed of flexible sheet material having structural characteristic means that precludes transmission of radio-frequency signals therethrough to provide radio-frequency shielding for equipment within the enclosed operations area;

d) said side wall portion being composed of flexible material and including a radio-frequency signal-secure ingress and egress opening means having a size sufficient to move said electronic equipment into and out of said enclosed operations area within the flexible enclosure means when the flexible enclosure means is in said upright position;

e) the side wall portion including radio-frequency signal-secure door member composed of flexible material and pivotally movable along one side thereof between a closed position and an open position and door frame structure means for providing stability along an edge portion of the opening means to support the door member in a closed position with respect to the opening means, and f) said door frame structure means including radio-frequency signal-securing means to prevent radio-frequency signal transmission into or out of the flexible enclosure means along an outer edge of the door member and the adjacent edge portion of the opening means when the door member is in a closed position with respect to the opening means, g) said flexible enclosure means includes electrical power bulkhead panel means for supplying electrical power to the equipment, said bulkhead panel means constituting penetration hardware rated for radio-frequency signal attenuation.

19. A tent assembly as defined in claim 18 wherein said bulkhead panel is mounted to frame structure means fixedly connected to the side wall portion adjacent the bottom floor portion.

20. A tent assembly as defined in claim 19 wherein said means for stabilizing said bulkhead panel includes a pivotally mounted foot member for extending outwardly from the panel onto the bottom floor portion.

21. A tent assembly as defined in claim 19 wherein said bulkhead panel includes a radio-frequency signal filter, an electrical outlet receptacle, a circuit breaker assembly, and fiber optic guide means for signal entry and egress.

22. A tent assembly as defined in claim 19 wherein said bulkhead panel means includes means for stabilizing the bulkhead panel in an upright position.

23. A free-standing portable tent assembly for providing a shielded environment for operating electronic equipment, said assembly comprising:

a) support means for maintaining collapsible flexible enclosure means in an upright position to define an enclosed operations area sufficient to contain said equipment for effecting electronic operations;

b) said flexible enclosure means including a top ceiling portion, a bottom floor portion, and a side wall portion fixedly connected along a top edge to the top ceiling portion, and fixedly connected along a bottom edge to the bottom floor portion;

c) said flexible enclosure means is composed of flexible sheet material having structural characteristic means that precludes transmission of radio-frequency signals therethrough to provide radio-frequency shielding for equipment within the enclosed operations area;

d) said side wall portion being composed of flexible material and including a radio-frequency signal-secure ingress and egress opening means having a size sufficient to move said electronic equipment into and out of said enclosed operations area within the flexible enclosure means when the flexible enclosure means is in said upright position;

e) the side wall portion including a radio-frequency signal-secure door member composed of flexible material and pivotally movable along one side thereof between a closed position and an open position and door frame structure means for providing stability along an edge portion of the opening means to support the door member in a closed position with respect to the opening means, and f) said door frame structure means including radio-frequency signal-securing means to prevent radio-frequency signal transmission into or out of the flexible enclosure means along an outer edge of the door member and the adjacent edge portion of the opening means when the door member is in a closed position with respect to the opening means, g) said support means including a plurality of pocket members and stabilizer means to maintain the collapsible flexible enclosure means in said upright position, h) said stabilizer means includes a plurality of stabilizer members each having structural configuration means effective to fit within a pocket member.

* * * * *